(12) United States Patent
Mawatari et al.

(10) Patent No.: US 8,294,261 B2
(45) Date of Patent: Oct. 23, 2012

(54) PROTRUDING TSV TIPS FOR ENHANCED HEAT DISSIPATION FOR IC DEVICES

(75) Inventors: Kazuaki Mawatari, Beppu (JP); Kengo Aoya, Beppu (JP); Yoshikatsu Umeda, Beppu (JP); Jeffrey A. West, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 217 days.

(21) Appl. No.: 12/888,135

(22) Filed: Sep. 22, 2010

(65) Prior Publication Data

US 2011/0186990 A1 Aug. 4, 2011

Related U.S. Application Data

(60) Provisional application No. 61/299,826, filed on Jan. 29, 2010.

(51) Int. Cl.
*H01L 23/34* (2006.01)
(52) U.S. Cl. .................. 257/712; 257/E23.08
(58) Field of Classification Search .................. None
See application file for complete search history.

(56) References Cited

U.S. PATENT DOCUMENTS

| | | | |
|---|---|---|---|
| 4,069,498 A * | 1/1978 | Joshi | 257/713 |
| 7,838,988 B1 * | 11/2010 | Gurrum et al. | 257/720 |
| 2009/0001568 A1 | 1/2009 | Mancera et al. | |
| 2009/0008792 A1 | 1/2009 | Ko et al. | |
| 2009/0115026 A1 | 5/2009 | Gerber et al. | |
| 2009/0278245 A1 | 11/2009 | Bonifield et al. | |
| 2010/0015792 A1 | 1/2010 | Lee et al. | |
| 2010/0171226 A1 | 7/2010 | West et al. | |

* cited by examiner

*Primary Examiner* — Ha Tran T Nguyen
*Assistant Examiner* — Kevin Quinto
(74) *Attorney, Agent, or Firm* — Steven A. Shaw; W. James Brady; Frederick J. Telecky, Jr.

(57) ABSTRACT

An integrated circuit (IC) device includes a substrate having a top surface including substrate pads, and a through substrate via (TSV) die including a semiconductor substrate including a topside semiconductor surface having active circuitry and a bottomside surface. The topside semiconductor surface includes bonding connectors that are coupled to the substrate pads on the top surface of the substrate. A plurality of TSVs include an inner metal core that extends from the topside semiconductor surface to protruding TSV tips which extend out from the bottomside surface. At least one of the plurality of TSVs are dummy TSVs that have their protruding TSV tips exclusive of any electrically connection thereto that provide additional surface area that enhances heat dissipation from the bottomside of the TSV die.

19 Claims, 5 Drawing Sheets

PROTRUDING TSV TIPS FOR ENHANCED HEAT DISSIPATION FOR IC DEVICES

CROSS REFERENCE TO RELATED APPLICATIONS

This application claims the benefit of Provisional Application Ser. No. 61/299,826 entitled "Method of Semiconductor Package Heat Dissipation", filed Jan. 29, 2010, which is herein incorporated by reference in its entirety.

FIELD

Disclosed embodiments relate to integrated circuits (ICs) including through substrate vias, such as through silicon vias.

BACKGROUND

Electronic signals are carried by electrical current through conductors and transistors in a large scale IC die fabricated on a semiconductor wafer. The energy carried by the electrical current in an IC die is partially dissipated along the paths of current flow through the IC in the form of heat. The heat generated, P, in an IC is the sum of dynamic power, $P_D$, and static power, $P_S$:

$$P = P_D + P_S = ACV_2f + VI_{leak}$$

where A is the gate activity factor, C is the total capacitance load of all gates, $V_2$ is the peak-to-peak supply voltage swing, f is the frequency, and $I_{leak}$ is the leakage current. The static power term, $P_S = VI_{leak}$, is the static power dissipated due to leakage current, $I_{leak}$. The dynamic power term, $P_D = ACV_2f$, is the dynamic power dissipated from charging and discharging the IC's capacitive loads.

Another characteristic of IC die is the uneven distribution of temperature on the die. More and more functional blocks are integrated in a single die in system-on-chip (SOC) designs. Higher power density blocks create an uneven temperature distribution and lead to "hotspots," also known as "hot blocks," on the die. Hotspots can lead to a temperature difference of about 5° C. to roughly 30° C. across a die. Since carrier mobility is inversely proportional to temperature, the clock speed is typically designed for the hottest spot on the die. Consequently, thermal design is driven by the temperature of these on-die hotspots. Also, if uniform carrier mobility is not achieved across the IC die due to on-chip temperature variations across the die, this may result in variations in signal speed and in complicating circuit timing control.

Heat spreaders, including drop-in heat spreaders, heat sinks, and heat pipes have been used in the past to enhance thermal performances of IC packages. In addition, another known approach is attaching a high thermal conductivity lid directly to the backside of the die to improve heat spreading. A significant problem with known practices is that the frontside of the die where the hot spots are located (e.g., near where transistors switching takes place) must be used for wiring and the heat generated during operation must be channeled out through the full thickness of the substrate of the IC die to its bottomside before being connected to heat dissipation means, and are thus inefficient at dissipating heat.

SUMMARY

Disclosed embodiments describe IC devices comprising a substrate having a top surface including substrate pads, and a TSV die on the top surface of the substrate. The TSV die comprises a topside semiconductor surface including active circuitry and a bottomside surface, wherein the topside semiconductor surface includes bonding connectors that are coupled to the substrate pads on the top surface of the substrate. A plurality of TSVs are on the IC die that comprise an inner metal core that extend from the topside semiconductor surface to protruding TSV tips that extend out from the bottomside surface.

At least one of the plurality of TSVs are "dummy TSVs" defined herein as TSVs having no electrical function for the IC device. Dummy TSVs have their protruding TSV tips exclusive of any electrical connection thereto. Dummy TSVs may be contrasted to conventional functional TSVs, referred to herein as "active TSVs", which include an electrical connection to the TSV tips for providing an electrical function for the IC device, such as for coupling VDD, VSS or signals from the TSV die to other circuitry (e.g., another IC or discretes) above or below the TSV die.

Disclosed embodiments provide a higher thermal conductivity path as compared to the conventional thermal paths through the substrate (e.g., Si) of the TSV die that improves heat transfer from the topside of the die to the bottomside of the die. The protruding TSV tips significantly increase the surface area on the bottomside of the TSV die that significantly improves radiative heat transfer and thus heat dissipation.

The Inventors have recognized that the inner metal core of the TSVs provide reduced thermal resistance for heat transfer from the topside semiconductor surface and the bottomside surface because metals such as copper have a thermal conductivity that is higher as compared to most substrate materials. For example, copper has a thermal conductivity of about 398 W/m·K, as compared to silicon, for example, that has a thermal conductivity of about 168 W/m·K. The thermal conductivity of the substrate may be even less for substrates such as semiconductor on insulator (SOI), GaAS, Ge, SiC, and other semiconductors other than bulk Si.

DETAILED DESCRIPTION

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
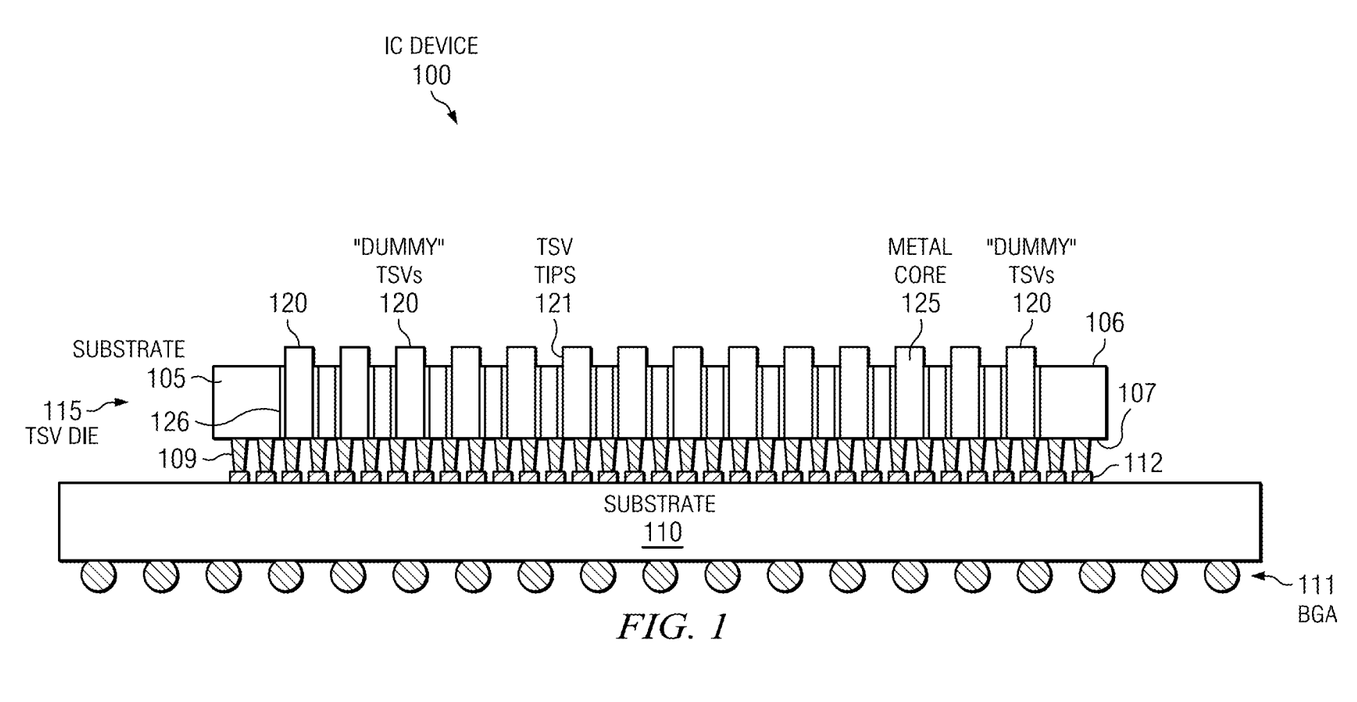
FIG. 1 is a side view depiction of an IC device comprising a TSV die on a substrate, where the TSV die includes a plurality of dummy TSVs having protruding tips for enhanced heat transfer from the TSV die, according to a disclosed embodiment.

FIG. 1 is a side view depiction of an IC device 100 comprising a TSV die 115 on a substrate 110, where the TSV die 115 includes a plurality of dummy TSVs 120 having protruding TSV tips 121 that provide additional surface area on the bottomside surface 106 of the TSV die 115 for enhanced heat transfer from the TSV die, according to a disclosed embodiment. TSV die comprises a semiconductor comprising substrate 105 including a topside semiconductor surface 107 and a bottomside surface 106. The topside semiconductor surface 107 is shown including bonding connectors 109 shown as pillars (e.g., copper pillars, that may be solder capped), that are connected to bond pads (not shown) on the TSV die 115. The substrate 105 can comprise a variety of substrates such as silicon comprising substrates (e.g., bulk silicon substrate), silicon germanium, silicon carbide, GaN, or a silicon on insulator (SOI) substrate.

As described above, "dummy TSVs" are TSVs having no electrical function for the IC device 100, since their protruding TSV tips are exclusive of any electrically connection thereto. Dummy TSVs may be contrasted to conventional active TSVs which include an electrical connection to the TSV tips for providing an electrical function for the IC device, typically transmitting VSS, VDD or signals to devices above or below the TSV die. As shown in FIG. 1, all the TSVs are dummy TSVs 120. The length (or tip height) of the protruding TSV tips 121 is typically from 5 to 50 µm, and the cross sectional area defining dimension (e.g., diameter) of the TSVs 120 is generally from 8 to 40 µm. Although TSVs are generally described herein as having a circular cross section, TSVs can have other cross sectional shapes including rectangular or square, for example.

The substrate 110 is shown as a printed circuit board (PCB) substrate having a ball grid array (BGA) 111. Substrate 110 can comprise a variety of other substrates, such as an organic substrate, a ceramic substrate, a silicon substrate, or a silicon interposer. The substrate 110 includes substrate pads 112 that are coupled to bonding connectors 109 shown as pillars on the TSV die 115.

The plurality of dummy TSVs 120 are shown comprising an inner metal core 125 that extends from the topside semiconductor surface 107 to protruding TSV tips 121 that extend out from the bottomside surface 106. The plurality of dummy TSVs 120 are also shown including a dielectric liner 126. The dielectric liner 126 is seen to be absent from the TSV tips 121, and is more generally absent from at least 50% of the length of the TSV tips 121.

Figure 2:
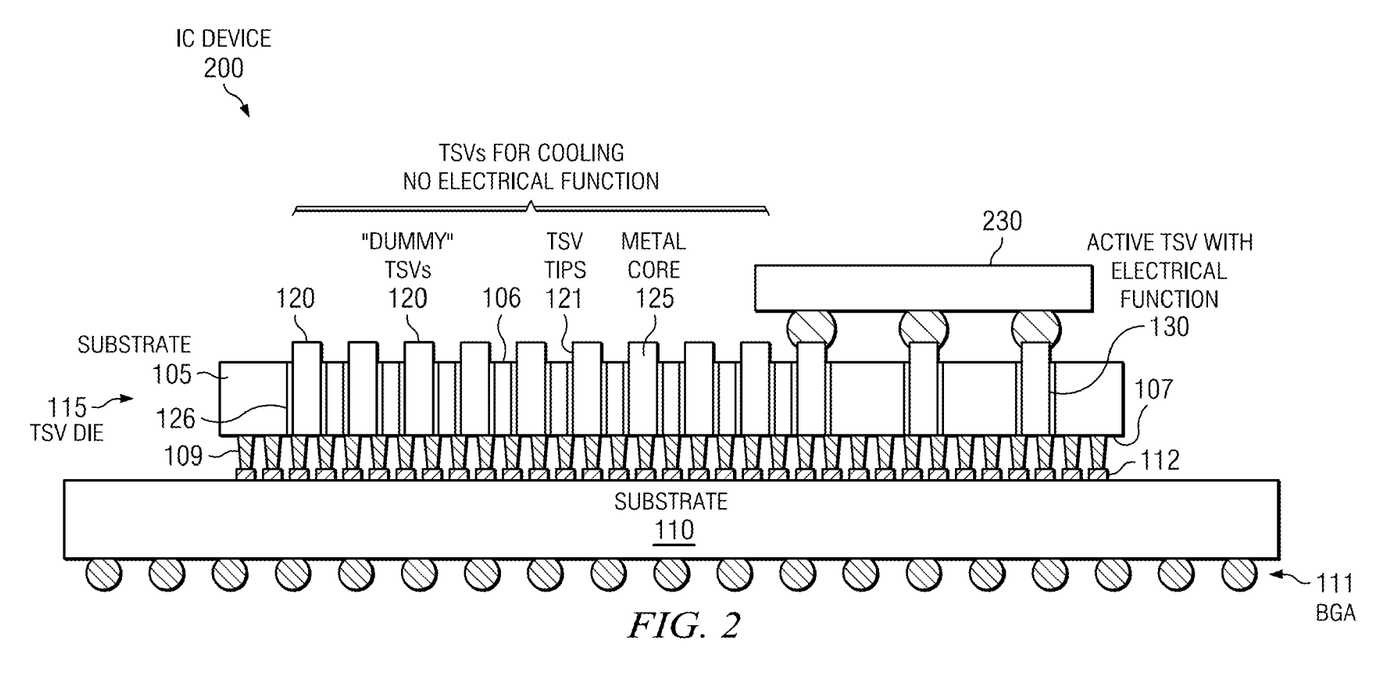
FIG. 2 is a side view depiction of an IC device comprising a topside device on a TSV die on a package substrate, where the TSV die includes a plurality of dummy TSVs having protruding tips for enhanced heat transfer and a plurality of conventional active TSVs, and where the topside device is coupled to the TSV die by connection to the active TSVs, according to a disclosed embodiment.

FIG. 2 is a side view depiction of an IC device 200 comprising a topside device 230 on a TSV die 115 on a package substrate 110, where the TSV die 115 includes a plurality of dummy TSVs 120 having protruding TSV tips 121 and a plurality of conventional active TSVs 130, where the topside device 230 is coupled to the TSV die 115 by connection to the active TSVs 130, according to a disclosed embodiment. Topside device 230 can include at least one IC that is coupled to the plurality of active TSVs 130. Topside device 230 can also comprise devices other than ICs, such as comprising capacitors, resistors, etc. to provide a stack referred to in the art as "integrated heterogeneous chip integration".

IC device 200 and other IC devices herein are shown without a lid. However, in other embodiments a lid is included. A lid can be attached in a variety of ways including using thermally conductive adhesive paste, sheet, grease or a thermally conductive adhesive. Solder paste with reflow is another exemplary attachment option.

Figure 3:
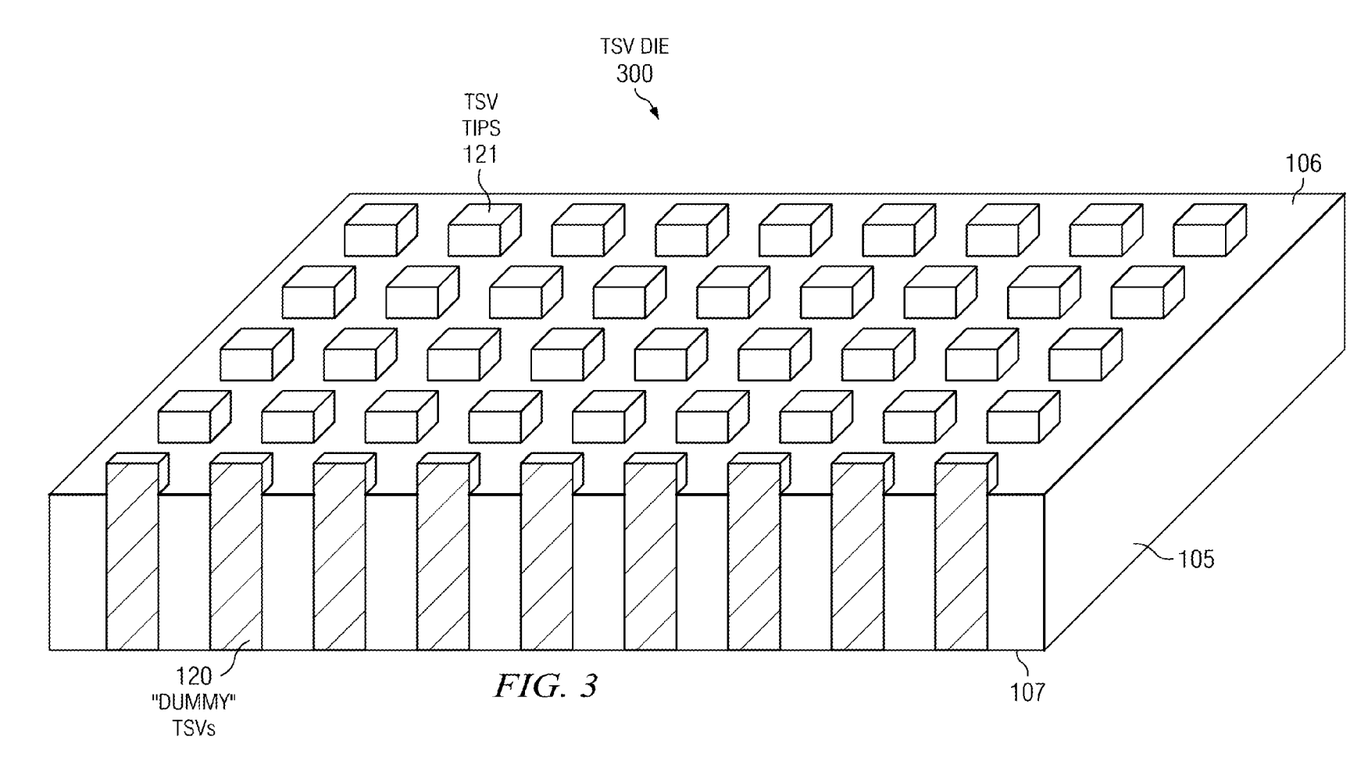
FIG. 3 is a depiction of a TSV die where the TSVs comprise a plurality of dummy TSVs that are arrayed substantially uniformly throughout said TSV die, according to as disclosed embodiment.

FIG. 3 is a depiction of a TSV die 300 where the TSVs comprise a plurality of dummy TSVs 120 that are arrayed substantially uniformly throughout the area (in both the x-direction and the y-direction) of the TSV die 300, according to as disclosed embodiment. For example, the TSVs in one particular embodiment can have 25 µm diameters and be positioned to provide a 50 µm center-to-center pitch. The dummy TSVs 120 are shown being columnar in shape having a square cross section. For a square die that is 5 mm on a side, such a TSV die can accommodate 10,000 TSVs. In the case of TSV tips having a circular cross section, each TSV tip 121 provides a "growth area" that is equal to the TSV tip 121 sidewall surface area (sidewall surface area of a cylinder), which is equal to $2\pi rh = 924 \ \mu m^2$ (where r is the radius of the TSV tip).

Although TSV die 300 includes an array of dummy TSVs that is periodic, the dummy TSVs may also be positioned in a non-periodic pattern. For example, dummy filled TSVs may be placed in close proximity to circuit hot spots, where, according to IC modeling or experience, high frequency and intense circuit integration cause extraordinary temperature increases during circuit operation. Such dummy TSV placements provide direct, short-cut paths for heat dissipation from the circuit, dummy TSVs can thus keep the IC device operating reliably in safe temperature regions.

Figure 4:
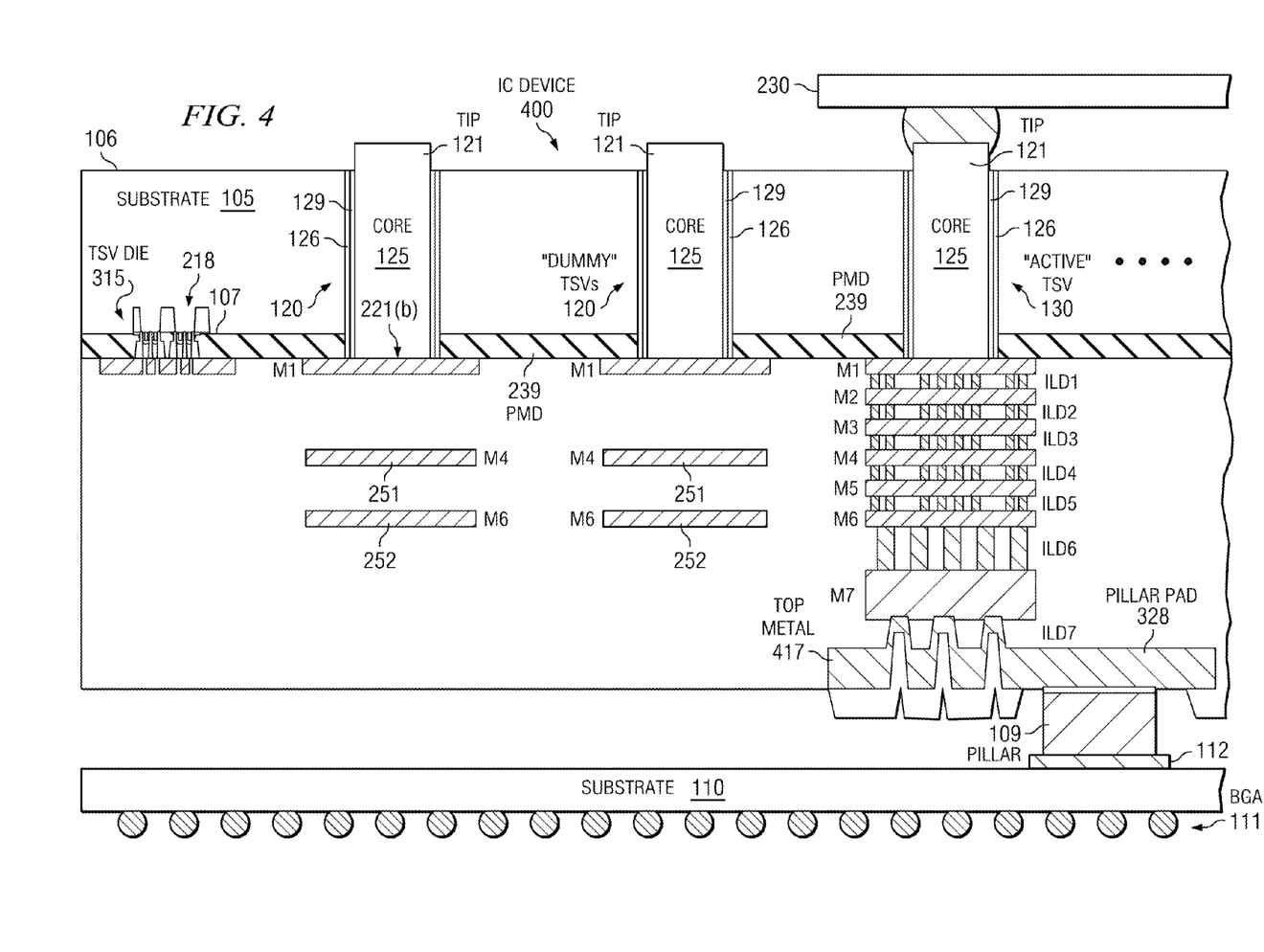
FIG. 4 is a simplified cross sectional depiction of a portion of an IC device comprising a TSV die including a TSV array including an active TSV and a plurality of dummy TSV, and a topside device that is coupled to the TSV die by connection to the active TSV, according to a disclosed embodiment.

FIG. 4 is a simplified cross sectional depiction of a portion of an IC device 400 comprising a TSV die 315 including a TSV array including an active TSV 130 and a plurality of dummy TSVs 120, and a topside device 230 that is coupled to the TSV die 315 by connection to the active TSV 130, according to a disclosed embodiment. TSV die 315 comprises a semiconductor substrate 105 having a topside surface 107, such as a silicon or silicon germanium surface, and a bottomside surface 107. TSV die 315 includes a plurality of metal interconnect levels generally comprising copper including an exemplary back end of the line (BEOL) stack comprising first to seventh metal interconnect levels shown as M1-M7. In this exemplary BEOL arrangement M1-M7 can comprise copper and a top (8$^{th}$) metal level 417 that can comprise aluminum shown used to also form pillar pad 328, so that the BEOL stack can be referred to as an 8 level metal stack. However, disclosed embodiments can be applied to BEOL stacks generally comprising any number of metal levels, that may or may not have a top metal level 417.

A pre-metal dielectric (PMD) 239 is shown between the top surface 107 and M1, and ILD layers comprising ILD1, ILD2, ILD3, ILD4, ILD5 and ILD6 shown comprising dielectric material that is positioned between respective ones of the plurality of metal interconnect levels M1 to M7, with ILD7 between M7 and the top metal level 417 that includes pillar pad 328. The ILD material can comprise a low-k dielectric or an ultra low-k dielectric layer, and be different (or the same) material for each of the ILD1, ILD2, ILD3, ILD4, ILD5, ILD6 and ILD7 layers.

Although the TSV die 315 shows the TSVs 120, 130 all terminating at M1 that defines their TSV terminating metal interconnect level, in other embodiments the TSV terminating metal interconnect level can terminate at metal levels above M1, including the top metal interconnect level (M7 shown in FIG. 4). Active circuitry shown as transistor 218 is formed on the topside surface 107 adjacent to one of the dummy TSVs 120. Although not shown, transistor 218 is coupled to other devices or components on the TSV IC 315 by one of the many possible connection options comprising M1, M2, M3 and M4, etc. and associated vias as shown in FIG. 4.

The active TSV 130 can be seen providing a feed through the substrate 105 for connection to topside device 230 on topside surface 106 of the TSV die 315, which is coupled to pillar 109 on pillar pad 328, with pillar 109 coupled as shown to a pillar pad 112 on substrate 110. The tips 121 of the dummy TSVs 120 can be seen to be electrically unconnected. Since dummy TSVs 120 are shown embedded below and terminating at M1, the volume above dummy TSVs 120 becomes available for routing interconnect metal lines. TSV IC 315 is shown including an M4 routing lines 251 and M6 routing lines 252 above dummy TSVs 120. Although not shown, routing lines 251 and 252 provide interconnection between various circuitry on TSV die 315. TSVs 120 and 130 comprise TSV inner metal core 125 (e.g., copper) that can be seen to extend from M1 which functions as the TSV terminating metal interconnect level downward through the bottom surface 107. The inner metal core 125 is shown surrounded by diffusion barrier metal (e.g., Ta, TaN, Ti, TiN, Mn, or Ru, or combinations thereof) 129 then by an outer dielectric liner (e.g., SiO$_2$, PSG, or SiN, or combinations thereof) 126. The diffusion barrier metal 129 formed on the dielectric liner 126 frames the TSVs 120, 130 and protects against escape of the TSV inner core 125 material into the substrate 105 in the case of highly mobile metal TSV core materials that are known to significantly reduce minority carrier lifetimes, such as copper in silicon, and cause problems such as significantly increased junction leakage or a shift in transistor threshold voltage (Vt).

Via-first, related via-middle, and via-last processes may be used to form disclosed TSV ICs. The via-first scheme describes a sequence in which substrate (e.g., silicon) through-vias are etched from the frontside of the wafer before wafer thinning, and are dielectrically insulated, and then metalized before the BEOL interconnect wiring levels are built. Conventional via-first processes forms the TSVs before formation of the transistors. A variant of the via-first process is the via-middle process where TSVs are etched and filled with an electrically conductive inner metal core after formation of the transistors but before the completion of the BEOL wiring levels. In the via-last scheme, the BEOL wiring levels are built first, and the through-via steps are completed either by etch and inner metal core fill processing from the topside after BEOL wiring and before wafer thinning, or to the bottomside of the wafer subsequent to BEOL wiring and wafer thinning.

In the case of via-last formation after wafer thinning, the TSVs in one embodiment are "topside surface offset TSVs" that are defined herein as TSVs that include TSV tips protruding from the bottomside of the TSV die that extend for >85% of the thickness of the semiconductor comprising substrate, but do not reach the topside surface of the substrate, such as being 2.5 to 8 μm away from the topside surface of the substrate. The thickness of the wafer may be about 30 to 50 μm after wafer thinning (e.g., backgrind), for example, which is generally performed before via-last TSV etch. The target etch depth in this embodiment depends on the substrate (e.g., silicon) thickness, its thickness non-uniformity across the wafer, and the capability (etch uniformity) of the etch tool used. Reducing the distance from the TSV to the topside surface improves cooling efficiency. In this embodiment all TSVs are dummy TSVs. Topside surface offset TSVs allow arbitrary placement of transistors and metal routing, thus allowing enhanced cooling without loss of available die area.

Figure 5:
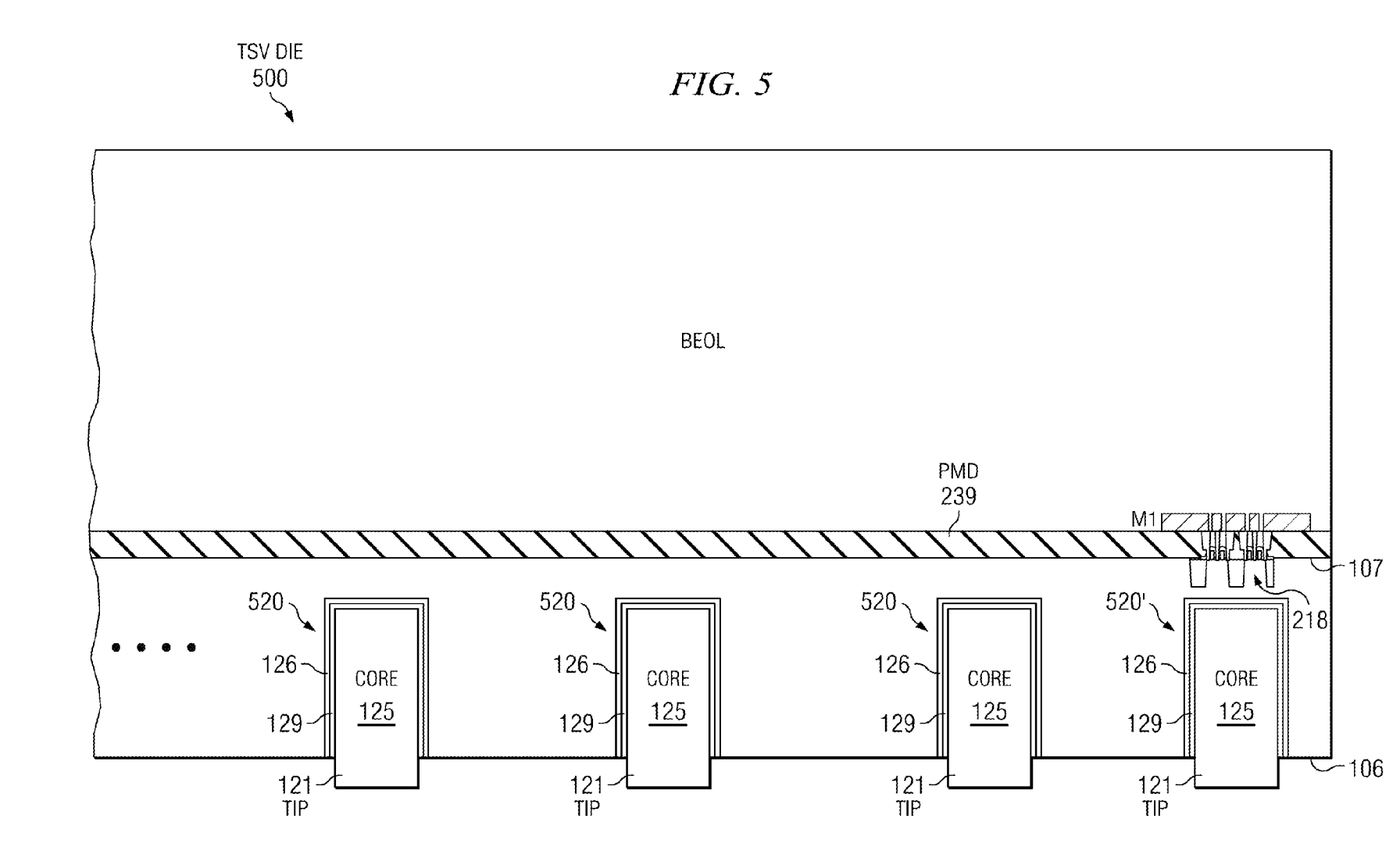
FIG. 5 is a simplified cross sectional depiction of a portion of TSV die including a TSV array including topside surface offset TSVs, according to a disclosed embodiment.

FIG. 5 is a simplified cross sectional depiction of a portion of TSV die 500 including a TSV array including topside surface offset TSVs 520, according to a disclosed embodiment. The TSVs 520 can be seen to terminate below the topside surface 107 below the vertical extent of the diffusions associated with transistor 218 and other devices on the TSV die 500. Transistor 218 is shown above the TSV identified as TSV 520'. TSV die 500 shows how topside surface offset TSVs allow circuitry (e.g., transistors, diodes resistors, etc.) to be formed in or on the topside surface 107 of the TSVs, thus allowing enhanced cooling without the loss of available area on TSV die 500.

One exemplary method for forming TSV die 500 having topside surface offset TSVs 520 is provided, described for a copper inner metal core process. Via-last vias for the TSVs are formed by a suitable etch process, followed by an optional dielectric liner deposition, then a barrier layer and seed deposition, and then electrochemical copper is deposited to fill the vias with a recipe that results in a relatively thin field (lateral to the TSV vias) deposition. The copper and barrier layer on the field regions can then be removed (e.g., wet strip or CMP), followed by a conventional substrate (e.g., silicon) dry etchback to create protruding TSV tips that extend out from the bottomside surface of the substrate. The dry etchback can be used to also recess the dielectric liner (if present).

Exemplary applications for disclosed embodiments include high power dissipation applications, including analog, power management, and application processors. However, a variety of other applications can benefit from disclosed embodiments. The active circuitry formed on the topside semiconductor surface comprises circuit elements that generally include transistors, diodes, capacitors, and resistors, as well as signal lines and other electrical conductors that interconnect these various circuit elements.

Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. An integrated circuit (IC) device, comprising:
    a substrate having a top surface including substrate pads, and
    a through substrate via (TSV) die including:
        a semiconductor comprising substrate including a topside semiconductor surface having active circuitry and a bottomside surface, wherein said topside semiconductor surface includes bonding connectors that are coupled to said substrate pads on said top surface of said substrate;
        a plurality of TSVs comprising an inner metal core that extends from said topside semiconductor surface to protruding TSV tips that extend out from said bottomside surface,
        wherein at least one of said plurality of TSVs are dummy TSVs that have their protruding TSV tips exclusive of any electrically connection thereto.

2. The IC device of claim 1, wherein a length of said protruding TSV tips is from 5 to 50 µm.

3. The IC device of claim 2, wherein said inner metal core comprises copper, said plurality of TSVs include a dielectric liner and a barrier layer on said dielectric liner, and wherein said dielectric liner is absent from at least 50% of said length of said protruding TSV tips.

4. The IC device of claim 1, wherein said TSV die comprises a topmost device for said IC device.

5. The IC device of claim 1, wherein said plurality of TSVs include a plurality of said dummy TSVs, wherein said plurality of said dummy TSVs are arrayed randomly throughout said TSV die.

6. The IC device of claim 1, wherein said plurality of TSVs include a plurality of said dummy TSVs, and wherein said plurality of dummy TSVs are arrayed substantially uniformly throughout said TSV die.

7. The IC device of claim 1, wherein said TSV die includes a plurality of metal interconnect levels, wherein said plurality of TSVs are directly connected to a first metal interconnect level (M1) of said plurality of metal interconnect levels.

8. The IC device of claim 1, wherein said plurality of TSVs include a plurality of said dummy TSVs and a plurality of active TSVs.

9. The IC device of claim 8, further comprising at least one topside device including at least one IC coupled to said plurality of active TSVs.

10. The IC device of claim 1, wherein said plurality of TSVs include a plurality of topside surface offset TSVs, wherein said plurality of topside surface offset TSVs terminate below a vertical extent of diffusions associated with said active circuitry on said TSV die.

11. An integrated circuit (IC) device, comprising:
    a substrate having a top surface including substrate pads, and
    a through substrate via (TSV) die that provides a topmost device for said IC device, including:
        a semiconductor comprising substrate including a topside semiconductor surface having active circuitry and a bottomside surface, wherein said topside semiconductor surface includes bonding connectors that are coupled to said substrate pads on said top surface of said substrate;
        a plurality of TSVs comprising an inner metal core that extends from said topside semiconductor surface to protruding TSV tips that extend out from said bottomside surface,
        wherein said plurality of TSVs comprise a plurality of dummy TSVs that have their protruding TSV tips exclusive of any electrically connection thereto,
        wherein a length of said protruding TSV tips is from 5 to 50 µm, said inner metal core comprises copper, said plurality of TSVs include a dielectric liner and a barrier layer on said dielectric liner, and wherein said dielectric liner is absent from at least 50% of said length of said protruding TSV tips.

12. A method of operating an integrated circuit (IC) device, comprising:
    providing said IC device comprising a substrate having a top surface including substrate pads, and a through substrate via (TSV) die including a topside semiconductor surface including active circuitry and a bottomside surface, wherein said topside semiconductor surface includes bonding connectors that are coupled to said substrate pads on said top surface of said substrate, said TSV die including a plurality of TSVs comprising an inner metal core that extends from said topside semiconductor surface to protruding TSV tips that extend out from said bottomside surface, wherein at least one of said plurality of TSVs are dummy TSVs that have their protruding TSV tips exclusive of any electrically connection thereto, and
    operating said IC device, wherein heat generated on said TSV die during said operating is transferred from said topside semiconductor surface to said protruding TSV tips of said dummy TSV for transfer to a surrounding gaseous ambient.

13. The method of claim 12, wherein said inner metal core comprises copper, said plurality of TSVs include a dielectric liner and a barrier layer on said dielectric liner, and wherein said dielectric liner is absent from at least 50% of a length of said protruding TSV tips.

14. The method of claim 12, wherein said TSV die comprises a topmost device for said IC device.

15. The method of claim 12, wherein said plurality of TSVs include a plurality of said dummy TSVs, wherein said plurality of said dummy TSVs are arrayed randomly throughout said TSV die.

16. The method of claim 12, wherein said plurality of TSVs include a plurality of said dummy TSVs, and wherein said plurality of dummy TSVs are arrayed substantially uniformly throughout said TSV die.

17. The method of claim 12, wherein said TSV die includes a plurality of metal interconnect levels, wherein said plurality of TSVs are directly connected to a first metal interconnect level (M1) of said plurality of metal interconnect levels.

18. The method of claim 12, wherein said plurality of TSVs include a plurality of said dummy TSVs and a plurality of active TSVs.

19. The method of claim 12, wherein said plurality of TSVs include a plurality of topside surface offset TSVs, wherein said plurality of topside surface offset TSVs terminate below a vertical extent of diffusions associated with said active circuitry on said TSV die.

* * * * *